(12) United States Patent
Horn et al.

(10) Patent No.: US 10,826,277 B2
(45) Date of Patent: Nov. 3, 2020

(54) OPTOELECTRONIC COMPONENT HAVING A HOUSING WITH A PLURALITY OF OPENINGS

(71) Applicant: OSRAM OLED GmbH, Regensburg (DE)

(72) Inventors: Markus Horn, Straubing (DE); Karsten Auen, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 14/892,242

(22) PCT Filed: May 27, 2014

(86) PCT No.: PCT/EP2014/060973
§ 371 (c)(1),
(2) Date: Nov. 19, 2015

(87) PCT Pub. No.: WO2014/191419
PCT Pub. Date: Dec. 4, 2014

(65) Prior Publication Data
US 2016/0126704 A1   May 5, 2016

(30) Foreign Application Priority Data
May 28, 2013 (DE) .......... 10 2013 209 919

(51) Int. Cl.
*H01L 33/48* (2010.01)
*H01S 5/40* (2006.01)
(Continued)

(52) U.S. Cl.
CPC .............. *H01S 5/4025* (2013.01); *F21K 9/64* (2016.08); *F21S 4/28* (2016.01);
(Continued)

(58) Field of Classification Search
CPC ...... F21V 31/005; F21V 21/088; F21V 5/007; F21V 15/01; F21V 15/015; F21V 19/045;
(Continued)

(56) References Cited

U.S. PATENT DOCUMENTS 6,483,030 B1 * 11/2002 Glenn ................ B29C 43/36
174/521
6,526,653 B1 * 3/2003 Glenn ................ H01L 23/04
174/521
(Continued)

FOREIGN PATENT DOCUMENTS

DE  100 08 240 A1  10/2000
DE  203 14 391 U1  12/2003
(Continued)

*Primary Examiner* — Isiaka O Akanbi
*Assistant Examiner* — Fatima N Farokhrooz
(74) *Attorney, Agent, or Firm* — DLA Piper LLP (US)

(57) ABSTRACT

An optoelectronic component includes a carrier with at least two radiation sources that generate electromagnetic radiation, including a housing consisting of a material non-transmissive to the electromagnetic radiation from the radiation sources, wherein at least two openings are provided in the housing, each opening is closed with a plate, the plate consists of a material transmissive to the electromagnetic radiation from the respective radiation source, and a radiation source is respectively assigned to an opening.

19 Claims, 5 Drawing Sheets

(51) Int. Cl.
*H01S 5/022* (2006.01)
*F21K 9/64* (2016.01)
*H01L 33/58* (2010.01)
*H01L 27/146* (2006.01)
*F21S 4/28* (2016.01)
*F21Y 105/10* (2016.01)
*F21Y 115/10* (2016.01)
*F21Y 115/30* (2016.01)

(52) U.S. Cl.
CPC ...... *H01L 27/14618* (2013.01); *H01L 33/483* (2013.01); *H01L 33/58* (2013.01); *H01S 5/02216* (2013.01); *H01S 5/02296* (2013.01); *F21Y 2105/10* (2016.08); *F21Y 2115/10* (2016.08); *F21Y 2115/30* (2016.08); *H01S 5/02288* (2013.01)

(58) Field of Classification Search
CPC ............ F21V 19/0055; F21Y 2115/10; F21Y 2101/00; F21Y 2105/10; F21Y 2101/025; F21Y 2105/001; H01S 5/4025; H01S 5/02296; H01S 5/02216; H01S 5/02288; F21K 9/56; F21S 4/28; H01L 27/14618; H01L 33/483; H01L 33/48; H01L 33/58; H01L 23/02; H01L 23/04; H01L 23/041; H01L 31/0203
See application file for complete search history.

(56) References Cited

U.S. PATENT DOCUMENTS

| | | | |
|---|---|---|---|
| 6,603,183 B1* | 8/2003 | Hoffman | H01L 27/14618 257/432 |
| 6,654,399 B1* | 11/2003 | Kimura | G01S 7/4815 257/432 |
| 7,751,458 B2 | 7/2010 | Regaard et al. | |
| 2003/0227547 A1* | 12/2003 | Iddan | A61B 1/00096 348/151 |
| 2004/0208020 A1* | 10/2004 | Ishida | F21V 5/04 362/545 |
| 2004/0223337 A1 | 11/2004 | Ishida | |
| 2008/0013329 A1 | 1/2008 | Takeda et al. | |
| 2008/0049800 A1* | 2/2008 | Hasegawa | H01S 5/02212 372/43.01 |
| 2008/0111141 A1* | 5/2008 | Li | H01L 33/54 257/88 |
| 2008/0291954 A1 | 11/2008 | Aphek et al. | |
| 2009/0086341 A1* | 4/2009 | Kikuchi | G02B 7/022 359/819 |
| 2009/0140416 A1* | 6/2009 | Ishida | H01S 5/02296 257/704 |
| 2009/0166653 A1 | 7/2009 | Weaver, Jr. et al. | |
| 2010/0295442 A1* | 11/2010 | Harbers | F21V 29/70 313/501 |
| 2011/0063824 A1* | 3/2011 | Qiu | F21L 4/027 362/188 |
| 2013/0033851 A1* | 2/2013 | Wang | F21V 31/005 362/101 |
| 2014/0041214 A1* | 2/2014 | Barlow | H05K 3/0052 29/841 |
| 2014/0197528 A1* | 7/2014 | Nagata | H01L 23/04 257/680 |
| 2014/0218964 A1* | 8/2014 | Kim | F21V 15/01 362/607 |
| 2014/0340904 A1* | 11/2014 | Biermann | F21V 7/00 362/267 |
| 2015/0356895 A1* | 12/2015 | Boppart | G09F 13/0404 362/511 |

FOREIGN PATENT DOCUMENTS

| | | |
|---|---|---|
| DE | 20 2009 008 928 U1 | 8/2009 |
| EP | 2 354 641 A2 | 8/2011 |
| EP | 2 375 141 A1 | 10/2011 |
| JP | 2007-019301 A | 1/2007 |
| JP | 2008-091234 A | 4/2008 |
| JP | 2008-140667 A | 6/2008 |
| JP | 2009-099633 A | 5/2009 |
| JP | 2010-199357 A | 9/2010 |
| JP | 2011-128424 A | 6/2011 |
| WO | 2012/093637 A1 | 7/2012 |

* cited by examiner

OPTOELECTRONIC COMPONENT HAVING A HOUSING WITH A PLURALITY OF OPENINGS

TECHNICAL FIELD

This disclosure relates to an optoelectronic component and a housing for an optoelectronic component.

BACKGROUND

It is known to provide an optoelectronic component comprising radiation sources with a housing. The housing protects the radiation sources against environmental influences. The housing has a single large opening, via which one or a plurality of radiation sources emit the electromagnetic radiation.

There is nonetheless a need to provide an improved optoelectronic component and an improved housing for an optoelectronic component.

SUMMARY

We provide an optoelectronic component including a carrier with at least two radiation sources that generate electromagnetic radiation, including a housing consisting of a material non-transmissive to the electromagnetic radiation from the radiation sources, wherein at least two openings are provided in the housing, each opening is closed with a plate, the plate consists of a material transmissive to the electromagnetic radiation from the respective radiation source, and a radiation source is respectively assigned to an opening.

We also provide an optoelectronic component including a carrier with at least two radiation sources that generate electromagnetic radiation, including a housing consisting of a material non-transmissive to electromagnetic radiation from the radiation sources, wherein at least two openings are provided in the housing, each opening is closed with a plate, the plate consists of a material transmissive to the electromagnetic radiation from the respective radiation source, a radiation source is respectively assigned to an opening, the housing has a cover having a depression with a housing wall in a region of an opening, the housing wall has a bearing face surrounding the opening, the plate is arranged at least partly in the depression, the plate bears on the bearing face and is fixed on the bearing face, the bearing face is arranged offset relative to an underside of the cover, and a distance between the underside of the cove and the bearing face is greater than or equal to the thickness of the plate.

LIST OF REFERENCE SIGNS

1 Component
2 Carrier
3 First radiation source
4 Second radiation source
5 Housing
6 Edge
7 Cover
8 Edge region
9 Opening
10 Plate
11 Underside
12 Top side
13 Depression
14 Housing wall
15 Bearing face
16 Connecting layer
17 Connecting face
18 Edge
19 First terminal
20 Second terminal
21 First row
22 Second row
23 Third row
24 Fourth row
25 First layer
26 Second layer
27 Laser bar
28 Radiation cone
29 Laser diode
30 Lens

DETAILED DESCRIPTION

One advantage of our optoelectronic component is that the housing has a plurality of openings to emit electromagnetic radiation. The openings are each covered with a plate. The plate consists of a material that transmits electromagnetic radiation. As a result of the arrangement of a plurality of small openings with small plates, in contrast to one large opening with one large plate, material for the plate is saved. In addition, smaller plates can be connected to the housing more reliably. In particular, the connection between the small plates and the housing has better long-term stability. On account of the smaller form of the individual plates, by way of example, thermal stresses between the plate and the housing are lower. Consequently, the connection between the plate and the housing is subjected to a lower mechanical stress. Furthermore, the housing is more stable since a plurality of small openings are provided in the housing rather than a single large opening. The plates consist of an expensive material. So, plate material and hence costs are saved by providing a plurality of smaller plates. The housing consists of a more cost-effective material. Consequently, the component can be produced more cost-effectively overall.

Each cover may have a depression surrounded by a housing wall in the region of the openings. The housing wall has a bearing face surrounding the opening. The respective plate bears on the bearing face and connects to the bearing face by a connecting layer. Consequently, the plate is arranged at least partly in the depression and set back at least partly relative to the top side of the housing. In this way, the plate in the depression is at least partly protected against mechanical damage. The depression may have a cross section similar to that of the plate, wherein the cross section of the depression is formed such that it is somewhat larger than the cross section of the plate. As a result, the mounting outlay is reduced since there is no need for separate alignment of the plate in relation to the opening. During mounting, the plate is simply inserted into the depression. Formation of the depressions results in an automatic alignment of the plates in relation to the opening surrounded by the bearing face. Consequently, complex alignment of the position of the plate is not necessary. It is also possible for a plurality of openings to be formed in a depression. In addition, it is also possible for a plurality of plates to be arranged in a depression.

The depression may be directed away from the radiation source. The depression is arranged in the cover of the housing and has a larger cross-sectional area than the opening in the region of that side of the cover assigned to the radiation source. In this way, electromagnetic radiation emitted by the radiation source is first delimited by the wider opening cross section of the depression. Afterward, the electromagnetic radiation is passed on through the plate in the direction of the opening. The opening itself has a precise edge contour that precisely defines and delimits a radiation cone of the radiation source. Improved beam guiding of the electromagnetic radiation is thus achieved.

The depression may be greater than or equal to the thickness of the plate. In this way, the plate can be completely accommodated in the depression. Consequently, in an arrangement of a plurality of plates alongside one another, a reflection of one plate in the direction of an adjacent plate will be avoided. Mutual scattering effects are reduced in this way.

The housing may have a frame circumferentially surrounding the cover. The frame has a circumferential edge connected to the carrier plate. Formation of a plurality of openings results in a larger distance between the circumferential edge and the individual openings, in particular the openings arranged in the center of the cover. As a result of the arrangement of a plurality of openings, the individual opening is at a greater distance from the edge. The edge is connected, in particular circumferentially hermetically impermeably connected, to the carrier plate by thermal methods after mounting the plates. By way of example, the connection can be in the form of a welded connection. As a result of the greater distance, the thermal effect when connecting the edge to the carrier plate, affecting the individual plate of the openings, in particular the connection of the plate to the bearing face, is smaller.

The radiation source may be in the form of a laser diode. By way of example, small openings can afford the advantage that an aperture of the radiation source is limited.

The plate may have a device, in particular a lens, to influence a direction of propagation of the electromagnetic radiation. In this example, either the plate itself can be a device that influences the direction of propagation of the electromagnetic radiation or a device that influences the direction of propagation of the electromagnetic radiation can be provided in addition to the plate. The arrangement of a plurality of openings results in the possibility of providing the individual plates with different devices that influence the electromagnetic radiation. Consequently, individual radiation sources can be influenced independently of the other radiation sources in terms of the direction of propagation.

The openings may be assigned devices that alter the wavelength of the electromagnetic radiation. In this way, the wavelengths of individual radiation sources can be set individually. In this example, the plate itself can also be a device that alters the wavelength of the electromagnetic radiation. The device can be designed to shift and/or block at least part of the wavelength spectrum of the radiation source.

The plates may be hermetically impermeably connected to the cover. Improved projection of the radiation sources is achieved in this way.

A laser bank having a plurality of laser diodes can also be provided as the radiation source. In this example, the laser diodes of a laser bank can be respectively assigned to an opening. In addition, the component can be configured such that each laser bank can be individually driven.

The cover may be produced from a metallic material. In addition, the depressions are preferably introduced into the metal plate of the cover with the aid of a deep-drawing method. Cost-effective production of the cover becomes possible in this way. In addition, a stiffened example of the cover is achieved as a result of the depressions.

The frame of the housing may connect to the carrier by a circumferential welded connection. The welded connection enables a mechanically stable connection to the carrier and additionally affords a hermetically impermeable connection.

The above-described properties, features and advantages and the way in which they are achieved will become clearer and more clearly understood in association with the following description of the examples which are explained in greater detail in association with the drawings.

Figure 1:
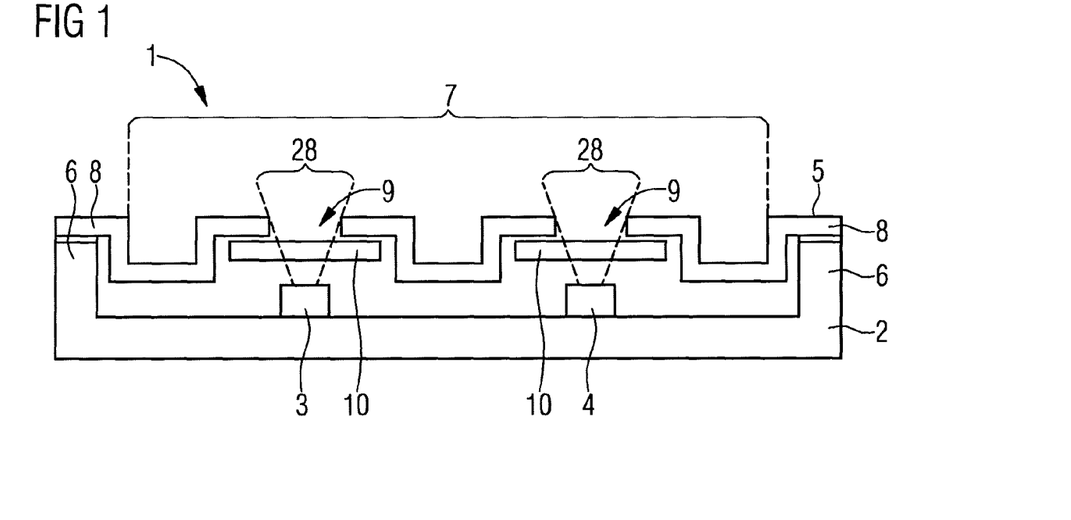
FIG. 1 shows a schematic cross section of a component with a housing.

FIG. 1 shows in a schematic illustration a cross section through an optoelectronic component 1 comprising a carrier 2, on which two radiation sources 3, 4 are arranged. The carrier 2 is covered by a housing 5 connected to the carrier 2. The housing 5 is placed onto a circumferential edge 6 of the carrier 2. The housing 5 may be circumferentially hermetically impermeably connected to the edge 6 of the carrier 2. The housing 5 has a cover 7 surrounded by a circumferential edge region 8. Openings 9 are provided in the cover 7. The cover 7 and the edge region 8 are integral, for example, and consist of a material that is non-transmissive to electromagnetic radiation from the radiation sources 3, 4. The term non-transmissive means a reduction of the radiation by more than 80%.

The openings 9 are covered with plates 10. The plates 10 may be hermetically impermeably connected to the cover 7. In the example illustrated, a radiation source 3, 4 is respectively assigned an opening 9. Via the opening 9, the electromagnetic radiation from the radiation source 3, 4 is emitted toward the outside. It is also possible for a plurality of radiation sources 3, 4 to be assigned to an opening 9. The radiation source 3, 4 can be, for example, in the form of a laser diode or a light emitting diode. The plate 10 is produced from a material transmissive to the electromagnetic radiation from the radiation sources 3, 4. The term transmissive means passage of more than 80% of the electromagnetic radiation.

By way of example, a metallic material can be used as material to form the housing. In addition, glass or plastic, for example, can be used as material to form the plate 10. It is also possible to use other materials to form the housing 5 and/or the plates 10.

As a result of the arrangement of a plurality of openings 9 in the cover 7, the cover 7 has an increased stability compared to one large opening. In addition, less material is required for the plates 10 compared to one large opening. Furthermore, it is possible to fix the plates 10 with a higher reliability on account of the small size on the cover 7. In particular, a hermetically impermeable connection between the plate 10 and the cover 7 can be produced more easily. Furthermore, formation of the relatively small openings 9 enables more precise beam guiding of the electromagnetic radiations from the individual radiation sources 3, 4. An aperture of the radiation sources 3, 4 can be limited by a suitable choice of the cross sections of the openings 9.

Figure 2:
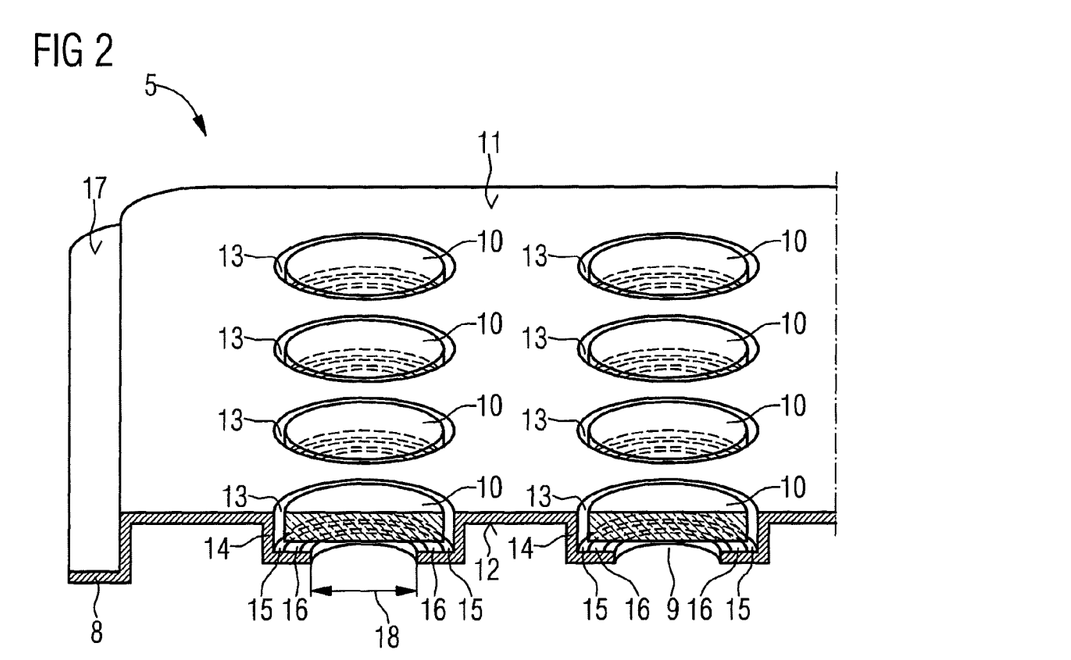
FIG. 2 shows a schematic cross section of a housing for a component.

FIG. 2 shows a perspective partial cross section through the housing 5 from FIG. 1 with a view of an underside 11 assigned to the radiation sources 3, 4 in the mounted state. The housing 5 has a cover 7 having depressions 13. The depressions 13 are delimited by a sleeve-shaped housing wall 14 that undergoes transition to a ring-shaped bearing face 15. The ring-shaped bearing face 15 delimits the openings 9. By way of example, a connecting layer 16 is applied on the bearing face 15. A plate 10 is placed on the connecting layer 16. The plate 10 is connected, in particular hermetically impermeably connected, to the bearing face 15 by the connecting layer 16. For this purpose, the connecting layer 16 is circumferentially formed around the opening 9. By way of example, a solder material, in particular a glass solder, can be used as material for the connecting layer 16. A separate connecting layer 16 can be dispensed with and a connection of the material of the plate to the material of the bearing face can be formed directly.

The depressions 13 can have a circular cross section. The plates 10 can correspondingly also be circular. The bearing face 15 is arranged in a manner spaced apart from the underside 11 of the cover 7. The bearing face 15 is aligned parallel to the underside 11 of the cover 7. A distance between the underside 11 of the cover 7 and the bearing face 15 is preferably chosen such that the plate 10 can be accommodated with its entire thickness in the depression 13. Consequently, the plate 10 does not project beyond the underside 11 of the cover 7.

It is possible to avoid reflection of electromagnetic radiation from a plate 10 to the adjacent plate 10. In addition, the plate 10 is protected against damage. This is advantageous, for example, when transporting the housing 5 prior to mounting with the carrier 2. In addition, forming the depressions 13 makes it possible to achieve a simple alignment of the plates 10 in relation to the openings 9 by virtue of the plates 10 being inserted into the depressions 13. The opening 9 is delimited by a precise edge 18 of the bearing face 15. The delimitation of the beam cone of the radiation source is precisely defined in this way. The other openings 9 are also provided with plates 10 in an analogous way.

The cover 7 is circumferentially delimited by the edge region 8 having a circumferential connecting face 17. The connecting face 17 connects to the edge 6 of the carrier 2 during mounting. By way of example, a welded connection connects the connecting face 17 to the carrier 2. As a result of the arrangement of a plurality of openings 9, the connecting face 17 is at a greater distance from the plates 10. This weakens the thermal influence when welding the connecting face 17 with the carrier 2 onto the plate 10 and the connecting layer 16 thereof.

Figure 3:
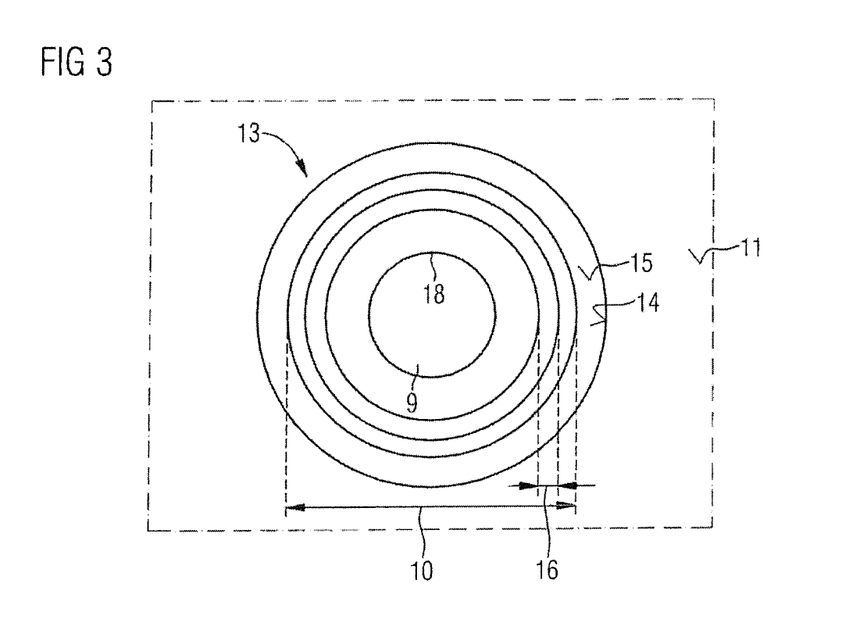
FIG. 3 shows a schematic illustration of an opening of the housing.

FIG. 3 shows in a schematic illustration a plan view of a depression 13 with the housing wall 14. It can clearly be discerned here that the connecting layer 16 is arranged circumferentially around the opening 9. After mounting the housing 5, the underside 11 is assigned to the radiation sources 3, 4. A top side 12 of the cover 7 arranged opposite the underside 11 is situated on the outer side of the housing 5 after mounting.

Figure 4:
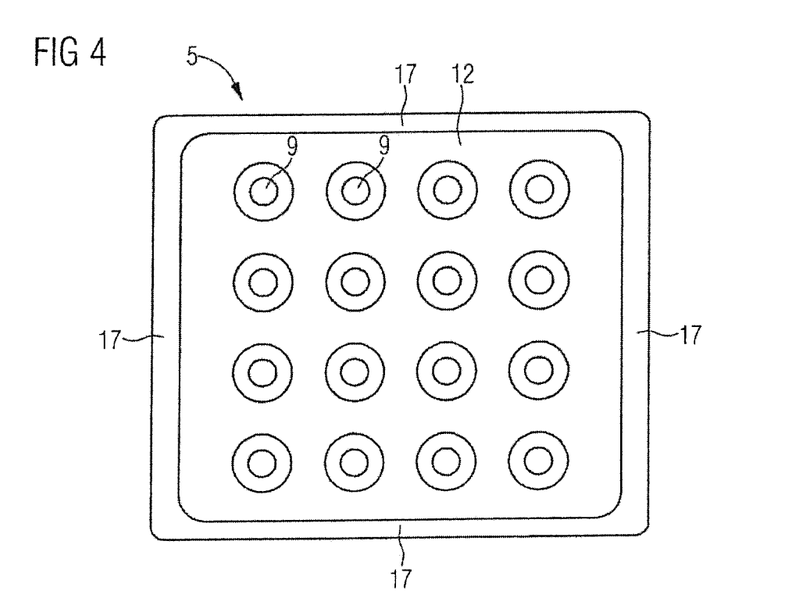
FIG. 4 shows a view of a top side of the housing.

FIG. 4 shows in a schematic illustration a plan view of a further example of a housing 5. The circumferential connecting face 18 is clearly discernible here. In addition, this example has 16 openings 9. More or fewer openings 9 can be provided. In addition, the cross section of the openings 9 can be circular, square, rectangular or else have other shapes. Furthermore, the arrangement of the openings 9 can be formed arbitrarily on the area of the cover 7.

Figure 5:
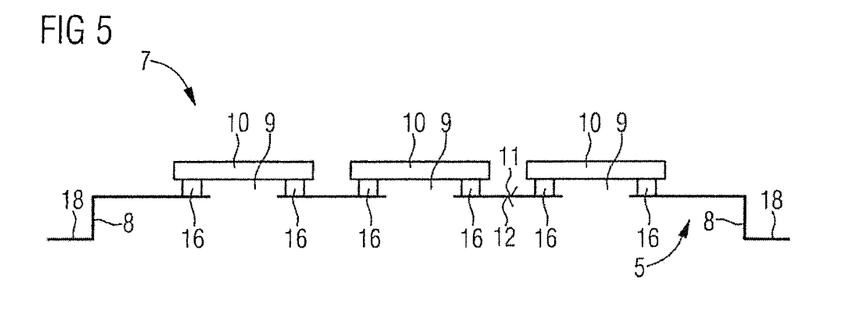
FIG. 5 shows a cross section through a further example of a housing.

FIG. 5 shows in a schematic illustration a cross section through a further example of a housing 5. In this example, no depressions 13 are provided. Rather, the plates 10 are placed on an underside 11 of the cover 7 and connected to the cover 7 by a connecting layer 16. The plates 10 can also be arranged on the top side 12 of the cover 7.

Figure 6:
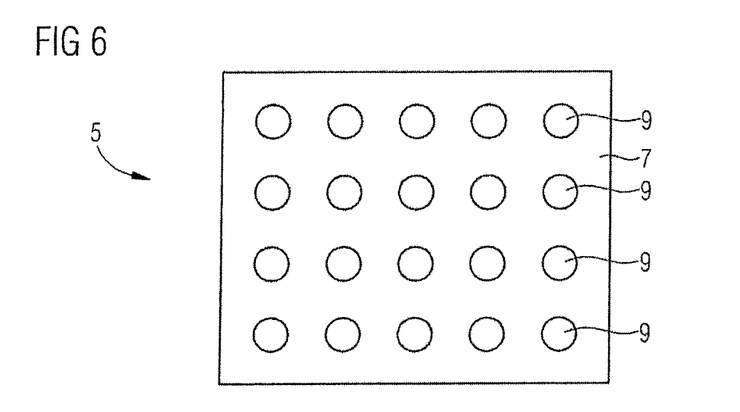
FIG. 6 shows a schematic illustration of a further example of a housing.

FIG. 6 shows in a schematic illustration a further arrangement of openings 9 in a housing 5, without illustrating the plates 10 that cover the openings 9. In this example, the openings 9 are provided in a uniform grid in a 5×4 arrangement. The openings 9 are circular. Correspondingly, the plates 10 can also be in the form of round circular disks. Moreover, the plates 10 can also have an angular shape, in particular a rectangular shape.

Figure 7:
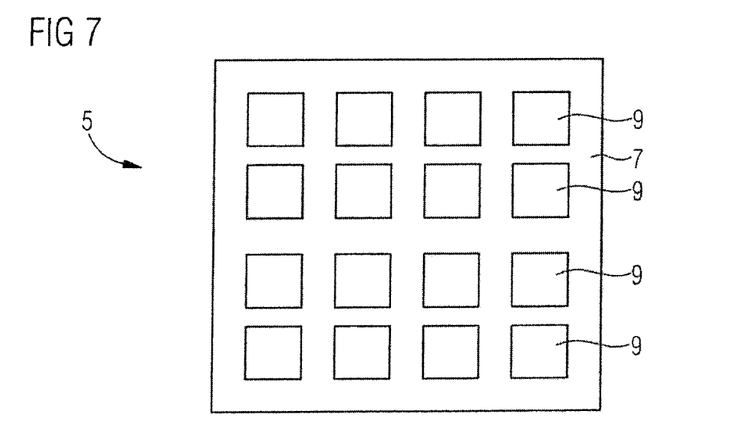
FIG. 7 shows a schematic illustration of a further example of a housing.

FIG. 7 shows by way of example a further example of a housing 5 in which the openings 9 have a rectangular cross section, in particular a square cross section. In this arrangement, the openings 9 are in a 4×4 arrangement. As already explained above, other shapes, numbers and cross sections of the openings 9 in the cover 7 of the housing 5 can also be provided. Correspondingly, the plates 10 can also have angular, in particular rectangular, shapes. Moreover, the plates 10 can also have a circular disk shape.

Figure 8:
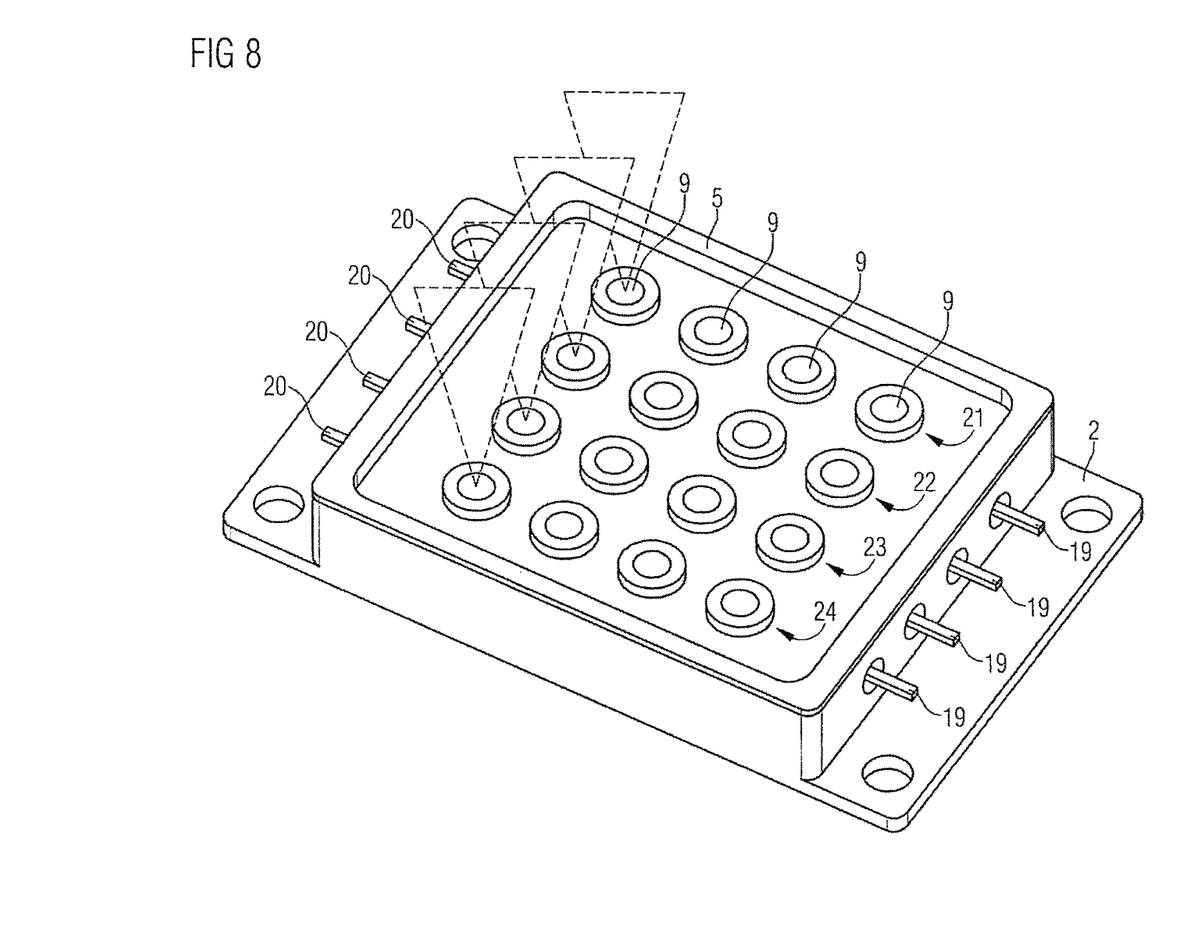
FIG. 8 shows a perspective illustration of a component with a housing.

FIG. 8 shows in a perspective illustration a component 1 comprising a carrier 2 and a housing 5. Openings 9 are provided in the cover 7 to be able to emit electromagnetic radiation from a radiation source. The component 1 comprises first electrical terminals 19 on a first side and second electrical terminals 20 on a second side. The component 1 can be such that, by way of example, in a first row 21 electromagnetic radiation having a first wavelength, in a second row 22 electromagnetic radiation having a second wavelength, in a third row 23 electromagnetic radiation having a third wavelength and in a fourth row 24 electromagnetic radiation having a fourth wavelength emerge from the openings 9. By way of example, the radiation sources of the individual rows 21, 22, 23, 24 can be driven separately from one another by the first and second terminals 19, 20. For this purpose, by way of example, radiation sources that emit the desired wavelength are provided and/or devices that alter the wavelength are provided which generate the desired wavelength from the electromagnetic radiation from the radiation sources.

Figure 9:
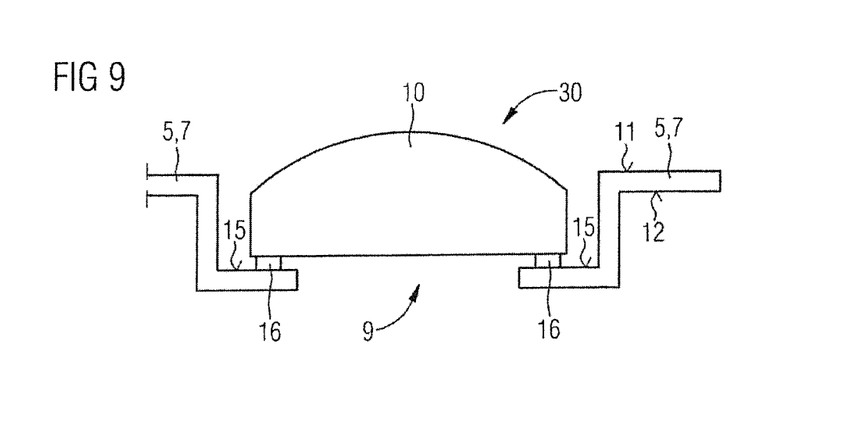
FIG. 9 shows a schematic cross section through an opening of a housing.

FIG. 9 shows in a cross section one example of an opening 9 of the cover 7 in which the plate 10 additionally performs the function of a lens 30. For this purpose, by way of example, one side of the plate 10 is shaped accordingly, as schematically illustrated. As a result of forming the plate 10 in the form of a lens or as a result of separately forming a lens in the opening 9, it is possible to shape, for example, concentrate the electromagnetic radiation through the opening 9 in a desired manner. This is advantageous particularly with the use of laser diodes as a radiation source. Moreover, in addition to the plate 10 a lens 30 can be provided at an opening 9.

Figure 10:
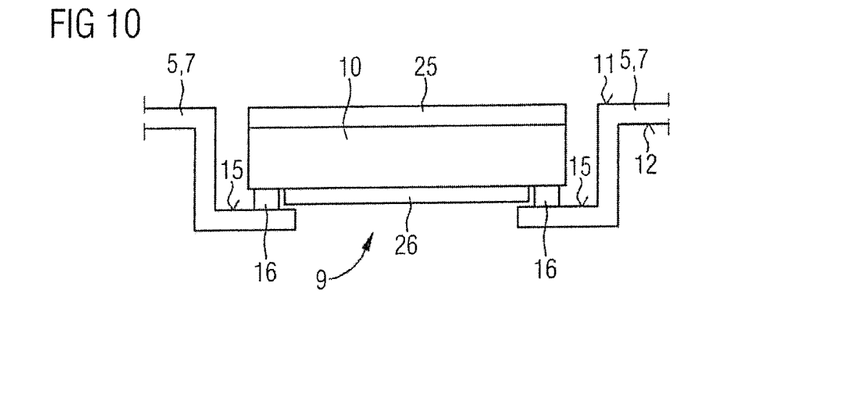
FIG. 10 shows a schematic cross section through a further example of an opening of a housing.

FIG. 10 shows a further example of an opening 9 of the housing 5 in which the plate 10 has a layer 25, 26 on an inner side and on an outer side, the layer bringing about a shift in the wavelength of the electromagnetic radiation. A first layer 25 is provided on the inner side. A second layer 26 is arranged on the plate 10 on the outer side. The first and second layers 25, 26 are, for example, in the form of a converting phosphor layer. The converting phosphor layer shifts the wavelength of the electromagnetic radiation incident on the phosphor layer. Phosphor laminae can also be provided instead of a phosphor layer.

In this way, by way of example, white light or some other desired wavelength can be generated from a laser diode having electromagnetic radiation having a blue wavelength. A corresponding layer that shifts the wavelength can also be provided only on one side of the plate 10. In addition, the plate 10 can also comprise corresponding material and thus perform the function of shifting at least part of the wavelength spectrum or filtering out a wavelength range. Consequently, forming a separate layer 25, 26 is not necessary in this example.

Furthermore, a combination of the arrangements in FIGS. 9 and 10 can also be provided. In this case, by way of example, the plate 10 can be in the form of a lens and additionally have a layer 25, 26 that brings about a shift in the wavelength. In addition, the layers 25, 26 can also be in the form of a filter that filters out a defined wavelength or a defined wavelength range from the spectrum of the electromagnetic radiation. Furthermore, the first and/or the second layer 25, 26 can be in the form of a separate element, i.e., a separate layer placed into the plate 10 and connected to the plate 10.

Figure 11:
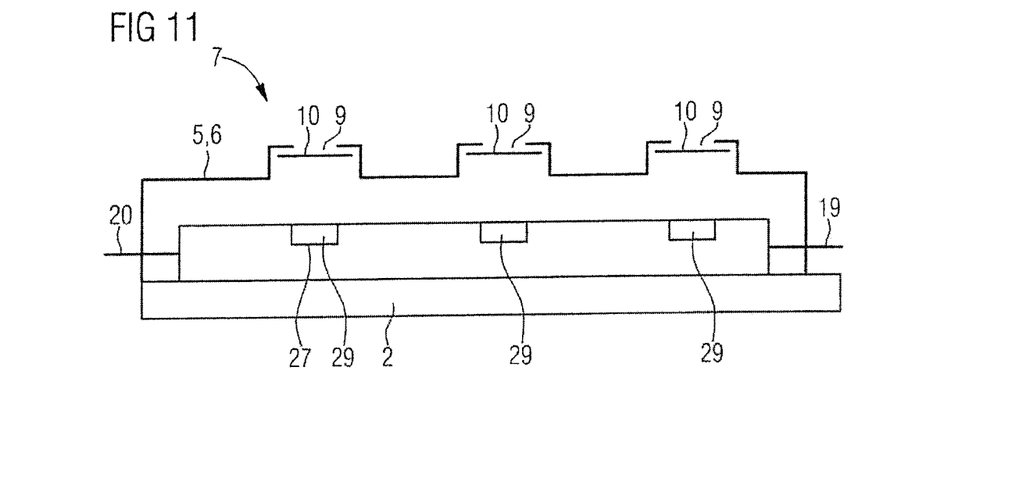
FIG. 11 shows a schematic cross section through a further example of a component with a housing.

Illustrated in FIG. 11, a schematic cross section through a housing 5 and a component 1 from FIG. 8 is illustrated. In this example, the radiation source is in the form of a laser bar 27 having a plurality of laser diodes 29 along a first row 21. Each laser diode 29 is assigned to an opening 9 of the housing. The laser bar 27 is individually drivable, for example, by provision of the two electrical terminals 19, 20.

Different devices that influence the radiation shape of the electromagnetic radiation can be provided in the different openings 9 of the described housings in FIGS. 1 to 11. In particular, different lenses can be provided in the corresponding openings 9.

Different devices that shift the wavelength of the electromagnetic radiation can be provided in the openings 9 of the housings 5. By way of example, in a row 21 of the openings 9 of the component 1 in accordance with FIG. 8, layers 25 can be provided which transmit a defined wavelength or at least partly shift the electromagnetic radiation into a desired wavelength range. Correspondingly, the rows 21, 22, 23, 24 of the component 1 can be provided with corresponding layers 25, 26. In this way, with the use of identical laser bars 27 or identical radiation sources, different wavelengths can nevertheless be emitted from the component 1 via the openings 9.

Instead of phosphor, other materials can also be used to bring about a filtering and/or a shift of the wavelength of the electromagnetic radiation.

Moreover, with the aid of the examples described, an RGBY module can be achieved by separate driving of individual laser banks of the four rows, the module emitting light in the colors red, green, blue and yellow. An aperture is defined by the size of the opening 9, the size being delimited in a defined manner, as a result of which stray light is suppressed.

Furthermore, provision of individual openings 9 makes it possible to provide in the openings 9 in each case a corresponding desired optical unit to influence both the scattering shaping and the wavelength spectrum of the electromagnetic radiation.

Although our components have been more specifically illustrated and described in detail by the preferred examples, nevertheless this disclosure is not restricted by the examples disclosed and other variations can be derived therefrom by those skilled in the art, without departing from the scope of protection of the appended claims.

This application claims priority of DE 10 2013 209 919.3, the disclosure of which is hereby incorporated by reference.

The invention claimed is:

1. An optoelectronic component comprising:
a carrier with at least two radiation sources that generate electromagnetic radiation,
a housing consisting of a material non-transmissive to the electromagnetic radiation from the radiation sources, a portion of the housing being a cover with at least two openings having a depression with a housing wall,
wherein each opening is closed with a plate, the plate consists of a material transmissive to the electromagnetic radiation from the respective radiation source, a radiation source is respectively assigned to an opening, the cover has a bearing face provided on a lower surface of the cover surrounding the opening, the plate is arranged at least partly in the depression, the plate bears on the bearing face and is fixed on the bearing face, the bearing face is arranged offset relative to an underside of the cover, a distance between the underside of the cover and the bearing face is greater than or equal to the thickness of the plate, an edge region of the housing having a connection face delimits the cover, the connection face connects to an edge of the carrier, the connection face is above the underside of the cover, the housing has two bends arranged between the edge region and the underside of the cover, and the underside of the cover is located between the at least two radiation sources.

2. The component as claimed in claim 1, wherein the housing has a cover and an edge region, the edge region circumferentially connects to the cover, and the edge region connects to the carrier.

3. The component as claimed in claim 1, wherein at least one radiation source is a laser diode.

4. The component as claimed in claim 1, wherein at least one opening is assigned a first device that influences a direction of propagation of the electromagnetic radiation, and the device is a lens.

5. The component as claimed in claim 1, wherein at least one opening is assigned a second device that alters a wavelength of an electromagnetic radiation, and the second device is a phosphor layer.

6. The component as claimed in claim 1, wherein the plates hermetically impermeably connect to the housing.

7. The component as claimed in claim 1, wherein the housing connects to the carrier by a circumferential welded connection.

8. The component as claimed in claim 1, wherein the radiation source are embodied in the form of at least two laser bars each having a plurality of laser diodes, and each laser bar is separately drivable via electrical terminals.

9. The component as claimed in claim 1, wherein the cover with the depressions is formed as one part.

10. The component as claimed in claim 1, wherein a portion of the cover is sleeve-shaped and connects to a ring-shaped bearing face, the plate connects to the cover by a circumferential connecting layer or a solder layer, and the plate is formed from glass, wherein the cover consists of a metallic material, and the depressions are deep drawn.

11. The component as claimed in claim 4, wherein two openings are assigned two different first devices that differently influence a direction of propagation of the electromagnetic radiation.

12. The component as claimed in claim 5, wherein two openings are assigned two different second devices, and the two devices change the wavelength of an electromagnetic radiation differently.

13. An optoelectronic component comprising a carrier with at least two radiation sources that generate electromagnetic radiation, comprising a housing consisting of a material non-transmissive to the electromagnetic radiation from the radiation sources, wherein at least two openings are provided in the housing, each opening is closed with a plate provided on a lower surface of the cover, the plate consists of a material transmissive to the electromagnetic radiation from the respective radiation source, and a radiation source is respectively assigned to an opening, an edge region of the housing having a connection face delimits the cover, the connection face connects to an edge of the carrier, the connection face is above the underside of the cover, the housing has two bends arranged between the edge region and the underside of the cover, and the underside of the cover is located between the at least two radiation sources.

14. The component as claimed in claim 13, wherein the plate connects to the housing by a circumferential connecting layer or a solder layer, and wherein the plate is formed from glass.

15. The component as claimed in claim 13, wherein the housing has a cover and an edge region, the edge region circumferentially connects to the cover, and the edge region connects to the carrier.

16. The component as claimed in claim 13, wherein at least one opening is assigned a second device that alters a wavelength of an electromagnetic radiation, and the second device is a phosphor layer.

17. The component as claimed in claim 13, wherein the plates hermetically impermeably connect to the housing.

18. The component as claimed in claim 13, wherein the housing consists of a metallic material, and the depressions are produced by deep-drawing.

19. The component as claimed in claim 13, wherein the housing connects to the carrier by a circumferential welded connection.

\* \* \* \* \*